United States Patent
Matsushima et al.

(10) Patent No.: US 12,431,440 B2
(45) Date of Patent: Sep. 30, 2025

(54) SiC COMPOSITE SUBSTRATE AND COMPOSITE SUBSTRATE FOR SEMICONDUCTOR DEVICE

(71) Applicant: NGK INSULATORS, LTD., Nagoya (JP)

(72) Inventors: Kiyoshi Matsushima, Nagoya (JP); Jun Yoshikawa, Nagoya (JP); Morimichi Watanabe, Nagoya (JP); Risa Miyakaze, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 819 days.

(21) Appl. No.: 17/445,505

(22) Filed: Aug. 20, 2021

(65) Prior Publication Data
US 2021/0384145 A1  Dec. 9, 2021

Related U.S. Application Data

(63) Continuation of application No. PCT/JP2020/004320, filed on Feb. 5, 2020.

(30) Foreign Application Priority Data

Mar. 27, 2019 (JP) .................... 2019-061502

(51) Int. Cl.
| | |
|---|---|
| *H10D 62/53* | (2025.01) |
| *H01L 23/00* | (2006.01) |
| *H10D 62/40* | (2025.01) |
| *H10D 62/832* | (2025.01) |

(52) U.S. Cl.
CPC ......... *H01L 23/562* (2013.01); *H10D 62/405* (2025.01); *H10D 62/53* (2025.01); *H10D 62/8325* (2025.01)

(58) Field of Classification Search
None
See application file for complete search history.

(56) References Cited

U.S. PATENT DOCUMENTS

| | | | | |
|---|---|---|---|---|
| 6,053,973 | A | * | 4/2000 | Tanino .................... C30B 29/36 117/9 |
| 6,579,359 | B1 | * | 6/2003 | Mynbaeva ............ C30B 29/406 257/E21.127 |
| 9,627,568 | B2 | | 4/2017 | Ichimura et al. |
| 10,625,371 | B2 | | 4/2020 | Hirata et al. |

(Continued)

FOREIGN PATENT DOCUMENTS

| | | |
|---|---|---|
| JP | H11-147794 A | 6/1999 |
| JP | 2961522 B | 10/1999 |

(Continued)

OTHER PUBLICATIONS

Machine translation of WO2014002576 A1 is attached (Year: 2014).*

(Continued)

*Primary Examiner* — Bilkis Jahan
(74) *Attorney, Agent, or Firm* — BURR PATENT LAW, PLLC

(57) ABSTRACT

Provided is a SiC composite substrate including a biaxially-oriented SiC layer in which SiC is oriented in both a c-axis direction and an a-axis direction, and a SiC polycrystalline layer provided on one surface of the biaxially-oriented SiC layer. Pores are present in the SiC composite substrate.

7 Claims, 2 Drawing Sheets

(56) References Cited

U.S. PATENT DOCUMENTS

| | | | |
|---|---|---|---|
| 10,680,068 B2 | 6/2020 | Imaoka et al. | |
| 2016/0087094 A1* | 3/2016 | Takaya | H10D 62/127 |
| | | | 257/48 |
| 2018/0251911 A1* | 9/2018 | Kubota | H01L 21/02513 |
| 2018/0265360 A1* | 9/2018 | Akiyama | H01L 21/02002 |
| 2019/0296125 A1* | 9/2019 | Schulze | H01L 21/0475 |

FOREIGN PATENT DOCUMENTS

| | | |
|---|---|---|
| JP | 2000-001399 A | 1/2000 |
| JP | 2000-053500 A | 2/2000 |
| JP | 2004-323293 A | 11/2004 |
| JP | 2017-059574 A | 3/2017 |
| JP | 2018-014372 A | 1/2018 |
| JP | 6429715 B | 11/2018 |
| WO | 2014/185339 A1 | 11/2014 |

OTHER PUBLICATIONS

International Search Report and Written Opinion (with English translation), International Application No. PCT/JP2020/004320, dated May 12, 2020 (20 pages).

* cited by examiner

SiC COMPOSITE SUBSTRATE AND COMPOSITE SUBSTRATE FOR SEMICONDUCTOR DEVICE

CROSS-REFERENCE TO RELATED APPLICATIONS

This application is a continuation application of PCT/JP2020/004320 filed Feb. 5, 2020, which claims priority to Japanese Patent Application No. 2019-061502 filed Mar. 27, 2019, the entire contents all of which are incorporated herein by reference.

BACKGROUND OF THE INVENTION

1. Field of the Invention

The present invention relates to a SiC composite substrate and a composite substrate for a semiconductor device.

2. Description of the Related Art

Heretofore, SiC (silicon carbide) has attracted attention as a wide bandgap material which can control large voltage and large electric power with low loss. In particular, in recent years, a power semiconductor device using a SiC material (SiC power device) has more excellent downsizing, low power consumption, and high efficiency than those of a power semiconductor device using a Si semiconductor, whereby the use of the power semiconductor device using the SiC material in various applications is expected. For example, by employing the SiC power device, a converter, an inverter, an on-board battery charger and the like for electric vehicles (EV) and plug-in hybrid electric vehicles (PHEV) can be downsized to provide improved efficiency.

Meanwhile, a SiC substrate is very expensive compared with a Si substrate. Then, a composite substrate has been proposed, which is obtained by combining a thin single-crystalline SiC substrate with an inexpensive polycrystalline SiC substrate. For example, Patent Literature 1 (JP2961522B) discloses a substrate for a semiconductor electronic device obtained by integrally joining a thin SiC single-crystalline wafer and a base substrate part to each other with an oxidation layer interposed therebetween. As described in Patent Literature 1, a SiC polycrystalline substrate part is preferably used as the base substrate part from the viewpoint of an improvement in a heat dissipation property. In the literature, the SiC single-crystalline wafer and the base substrate part are integrally joined to each other at room temperature in a state where the oxidation layer is interposed therebetween. Patent Literature 2 (JP2018-014372A) discloses a semiconductor substrate obtained by joining a single-crystalline SiC substrate and a polycrystalline SiC support substrate to each other. The single-crystalline SiC substrate and the polycrystalline SiC substrate are joined to each other by irradiating the substrates with a neutral atomic beam of argon to activate the substrates, and bringing surfaces of the substrates into contact with each other in a vacuum.

CITATION LIST

Patent Literature

Patent Literature 1: JP2961522B
Patent Literature 2: JP2018-014372A
Patent Literature 3: JP6429715B

SUMMARY OF THE INVENTION

However, as described in Patent Literatures 1 and 2, in the conventional SiC composite substrate obtained by joining the SiC single-crystalline substrate and the SiC polycrystalline substrate to each other, detachment of a joined surface (delamination), breaking and cracking may occur under the influence of a residual stress caused by the polishing of the surface of the single-crystalline SiC substrate.

The present inventors have now found that the presence of pores in a SiC composite substrate including a biaxially-oriented SiC layer and a SiC polycrystalline layer makes it possible to have the SiC composite substrate less likely to cause delamination, breaking and cracking, even if subjected to machining such as grinding and polishing.

Therefore, it is an object of the present invention to provide a SiC composite substrate that is less likely to cause delamination, breaking and cracking, even if subjected to machining such as grinding and polishing.

According to an aspect of the present invention, there is provided a SiC composite substrate comprising:
 a biaxially-oriented SiC layer in which SiC is oriented in both a c-axis direction and an a-axis direction; and
 a SiC polycrystalline layer provided on one surface of the biaxially-oriented SiC layer,
 wherein pores are present in the SiC composite substrate.

According to another aspect of the present invention, there is provided a composite substrate for a semiconductor device comprising:
 the SiC composite substrate; and
 a functional layer for a semiconductor device provided on the biaxially-oriented SiC layer of the SiC composite substrate.

DETAILED DESCRIPTION OF THE INVENTION

SiC Composite Substrate

Figure 1:
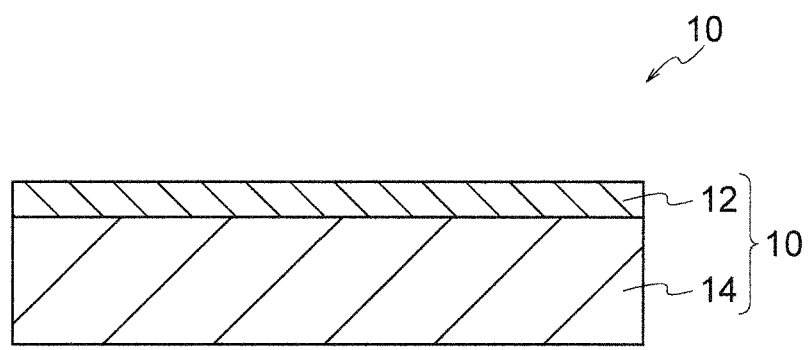
FIG. 1 is a schematic cross-sectional view showing an example of a SiC composite substrate of the present invention.

FIG. 1 schematically shows an example of a SiC composite substrate of the present invention. As shown in FIG. 1, a SiC composite substrate 10 includes a biaxially-oriented SiC layer 12 and a SiC polycrystalline layer 14. The biaxially-oriented SiC layer 12 is a layer in which SiC is oriented in both a c-axis direction and an a-axis direction. The SiC polycrystalline layer 14 is provided on one surface of the biaxially-oriented SiC layer 12. Pores (not shown) are present in the SiC composite substrate 10. Thus, the presence of pores in the SiC composite substrate 10 including the biaxially-oriented SiC layer 12 and the SiC polycrystalline layer 14 makes it possible to have the SiC composite substrate 10 less likely to cause delamination, breaking and cracking, even if subjected to machining such as grinding and polishing.

That is, as described in the above Patent Literatures 1 and 2, in a conventional SiC composite substrate obtained by joining a SiC single-crystalline substrate and a SiC polycrystalline substrate to each other, detachment of a joined surface (delamination), breaking and cracking may occur under the influence of a residual stress caused by the polishing of the surface of the single-crystalline SiC substrate. The SiC composite substrate 10 of the present invention can desirably solve these defects. This is considered to be because the residual stress caused in the SiC composite substrate 10 by machining such as grinding and polishing may be mitigated by the pores. That is, the delamination (the detachment of the joined surface), breaking and cracking of the substrate, which occur under the influence of the residual stress, are considered to be suppressed by the mitigation of the residual stress by the pores. As a result, the present invention can provide the SiC composite substrate that is less susceptible to delamination, breaking and cracking, even if subjected to machining such as grinding and polishing. In addition, the presence of the pores facilitates the grinding of the SiC composite substrate 10, whereby an improvement in a grinding rate can also be expected. Therefore, the SiC composite substrate 10 according to the present invention can be said to be extremely advantageous in that the SiC composite substrate is easily subjected to machining such as grinding and polishing when a semiconductor device is produced.

The biaxially-oriented SiC layer 12 is a layer in which SiC is oriented in both the c-axis direction and the a-axis direction, and may include both a polycrystalline layer containing a grain boundary and a single-crystalline layer containing no grain boundary. That is, the biaxially-oriented SiC layer 12 may be single crystalline, or polycrystalline as long as SiC is oriented in two axial directions of the c-axis direction and the a-axis direction. Alternatively, the biaxially-oriented SiC layer 12 may be a mosaic crystalline layer including a collection of crystals oriented so as to be slightly different in a c-axis direction, an a-axis direction, or both the directions without having a clear grain boundary.

The biaxially-oriented SiC layer 12 preferably has a defect density of $1.0 \times 10^1/cm^2$ or less, more preferably $1.0 \times 10^0/cm^2$ or less, and still more preferably $1.0 \times 10^{-1}/cm^2$ or less. The defect density is preferably lower, whereby the lower limit thereof may be 0 without particular limitation, but is typically $1.0 \times 10^0/cm^2$ or more. The defect includes threading screw dislocation (TSD), basal plane dislocation (BPD), and micropipe (MP).

The SiC polycrystalline layer 14 is provided on one surface of the biaxially-oriented SiC layer 12. The SiC polycrystalline layer 14 merely needs to be composed of a SiC polycrystalline body, and may be composed of a non-oriented polycrystalline body or an oriented polycrystalline body. That is, the SiC polycrystalline layer 14 may have orientation inferior to that of the biaxially-oriented SiC layer 12. This is because the SiC composite substrate 10 is assumed to exclusively use high orientation of the biaxially-oriented SiC layer 12, and the SiC polycrystalline layer 14 suffices to serve as a support for the biaxially-oriented SiC layer 12. Therefore, as compared with a substrate consisting of the biaxially-oriented SiC layer 12, the SiC composite substrate 10 can be more inexpensively manufactured or provided.

As described above, the pores are present in the SiC composite substrate 10. Typically, the pores are present in the SiC polycrystalline layer 14. The pores may also be present in the biaxially-oriented SiC layer 12, or no pores may be present in the biaxially-oriented SiC layer 12.

It is preferable that when the pores are also present in the biaxially-oriented SiC layer 12, the pores is present in a state where the pores are not opened to the surface of the biaxially-oriented SiC layer 12. That is, the biaxially-oriented SiC layer 12 contains the pores therein, but the pores are not present in a state where the pores are opened to the surface. When pores opened to the surface are present, it becomes difficult to form an epitaxial film or the like on the biaxially-oriented SiC layer 12.

It is preferable that when the pores are also present in the biaxially-oriented SiC layer 12, the number of the pores per 1 $cm^2$ of a unit cross-sectional area in the SiC polycrystalline layer 14 is greater than the number of the pores per 1 $cm^2$ of a unit cross-sectional area in the biaxially-oriented SiC layer 12 from the viewpoints of an improvement in stress mitigation and a reduction in the defect density. The number of the pores in the biaxially-oriented SiC layer 12 is preferably 0 to $1 \times 10^8$ pores/$cm^2$, more preferably 0 to $1 \times 10^6$ pores/$cm^2$, and still more preferably 0 to $1 \times 10^5$ pores/$cm^2$. The number of the pores in the SiC polycrystalline layer 14 is preferably $1 \times 10^2$ to $1 \times 10^9$ pores/$cm^2$, more preferably $1 \times 10^3$ to $1 \times 10^8$ pores/$cm^2$, and still more preferably $1 \times 10^4$ to $1 \times 10^7$ pores/$cm^2$. Herein, the number of the pores is determined in the following procedure. 1) Any polished cross-section of the SiC composite substrate 10 is observed by SEM, and a reflection electron image of each of 20 fields of view (size of one field of view: 178 μm×256 μm) including the biaxially-oriented SiC layer 12 and the SiC polycrystalline layer 14 is taken at 500× magnification. 2) The number of the pores of the SiC polycrystalline layer 14 or the biaxially-oriented SiC layer 12 of each of 20 fields of view is visually counted, and divided by the total cross-sectional area of the SiC polycrystalline layer 14 or the biaxially-oriented SiC layer 12 to calculate the number of the pores per 1 $cm^2$ of a unit cross-sectional area.

The pore diameter of the pores in the SiC polycrystalline layer 14 is preferably 0.2 to 6.0 μm, more preferably 0.5 to 5.0 μm, and still more preferably 0.8 to 4.0 μm. When the pores are also present in the biaxially-oriented SiC layer 12, the pore diameter of the pores in the biaxially-oriented SiC layer 12 is preferably 0.2 to 8.0 μm, more preferably 0.5 to 5.0 μm, and still more preferably 1.0 to 3.0 μm. Herein, the number of the pores is determined in the following procedure. 1) Any polished cross-section of the SiC composite substrate 10 is observed by SEM, and a reflection electron image of each of 20 fields of view (size of one field of view: 180 μm×253 μm) including the biaxially-oriented SiC layer 12 and the SiC polycrystalline layer 14 is taken at 500× magnification. 2) A numerical value obtained by increasing the average value of lengths of the longest sides of the pores of 20 fields of view by half is employed as a pore diameter.

Composite Substrate for Semiconductor Device

Figure 2:
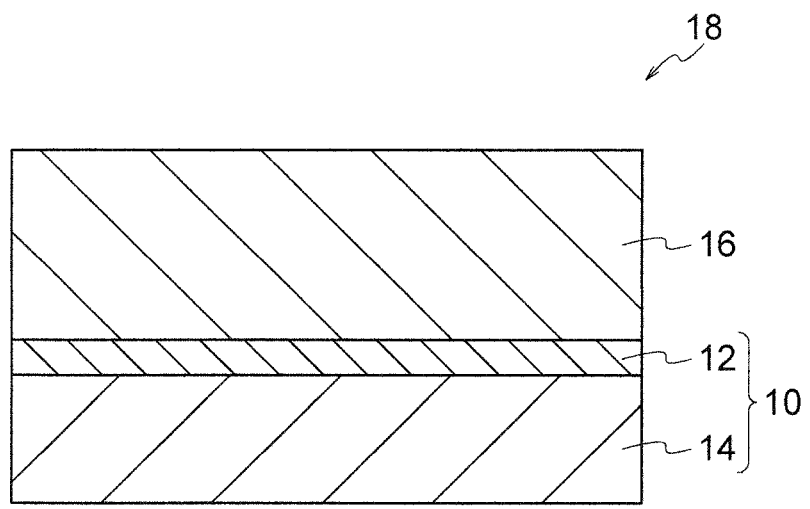
FIG. 2 is a schematic cross-sectional view showing an example of a composite substrate for a semiconductor device of the present invention.

The SiC composite substrate of the present invention is preferably incorporated in a composite substrate for a semiconductor device. Therefore, as shown in FIG. 2, a preferable aspect of the present invention provides a composite substrate 18 for a semiconductor device including the SiC composite substrate 10 and a functional layer 16 for a semiconductor device provided on the biaxially-oriented SiC layer 12 of the SiC composite substrate 10. Examples of the semiconductor device include a Schottky barrier diode (SBD), IGBT, and MOSFET. The structures and producing methods of the functional layer 16 for a semiconductor device and composite substrate 18 for a semiconductor device to be employed may be known according to the kind of the semiconductor device to be employed, and are not particularly limited.

Method for Manufacturing SiC Composite Substrate

The SiC composite substrate of the present invention can be manufactured by various manufacturing methods. Specific details are as follows.

A method for producing the SiC composite substrate is not particularly limited, and for example, on a SiC single-crystalline substrate, a biaxially-oriented SiC precursor layer is formed, or a biaxially-oriented SiC precursor green body is laminated, and then subjected to a heat treatment, whereby a part of the biaxially-oriented SiC precursor layer or the green body on the interface side with the single crystal can be formed by crystal grow as the biaxially-oriented SiC layer with the SiC single crystal as a seed crystal. At this time, a portion that has not been formed by crystal grow remains as the SiC polycrystalline layer in the biaxially-oriented SiC layer. Then, the SiC single-crystalline layer is removed by grinding or the like, or the SiC single-crystalline layer and the biaxially-oriented SiC layer are separated at the interface in a laser process or the like, whereby the SiC composite substrate can be produced. For example, Patent Literature 3 (JP6429715B) discloses a method for separating a wafer using a pulse laser as a laser process.

The SiC composite substrate can also be produced by bonding separately produced polycrystalline SiC to a SiC single crystal through direct joining. The direct joining method is not particularly limited, and for example, it may be performed by a heat treatment at a desired temperature in a state where surfaces are washed with acetone and ion exchange water and the like, and the surfaces to be joined are stacked. This heat treatment may be performed after previous activation by a hydrophilic or hydrophobic treatment, or during pressurization using hot press or the like in order to further improve adhesion. The polycrystalline SiC may be bonded to the SiC single crystal through the direct joining, and then subjected to a heat treatment, to form the biaxially-oriented SiC layer by crystal grow with the SiC single crystal as a seed crystal, thereby introducing pores into the biaxially-oriented SiC layer.

A method for forming the biaxially-oriented SiC precursor layer on the SiC single-crystalline substrate is not particularly limited as long as the biaxially-oriented SiC layer having pores is formed after the heat treatment, and known techniques can be employed. The pores may be formed in the biaxially-oriented SiC precursor layer; or the biaxially-oriented SiC precursor layer may be dense, or the pores may be produced when the biaxially-oriented SiC layer is formed, but the pores are preferably formed in the biaxially-oriented SiC precursor layer. For example, by using solid phase film formation methods such as an AD (aerosol deposition) method and an HPPD (hypersonic plasma particle deposition) method, gas phase film forming methods such as a sputtering method, a vapor deposition method, a sublimation method, and various CVD (chemical vapor phase epitaxy) methods, or liquid phase film forming methods such as a solution growth method, the biaxially-oriented SiC precursor layer can be directly formed on the SiC single-crystalline substrate. As the CVD method, for example, a heat CVD method, a plasma CVD method, a mist CVD method, an MO (organic metal) CVD method and the like can be used. A method can also be used, in which the polycrystalline body previously produced by the sublimation method, the various CVD methods, and sintering and the like is used as the biaxially-oriented SiC precursor layer, and the polycrystalline body is placed on the SiC single-crystalline substrate. Also in this case, the polycrystalline body preferably includes the pores. Alternatively, the method may be a technique in which the green body made of the biaxially-oriented SiC precursor is previously produced, and the green body is placed on the SiC single-crystalline substrate. Such a biaxially-oriented SiC precursor layer may be a tape formed body produced by tape forming, may be a green compact produced by pressure forming such as uniaxial press, or may be obtained by laminating the SiC polycrystalline body on the tape formed body or the green compact.

It is known that when the various CVD methods, the sublimation method, the solution growth method and the like are used in the technique of directly forming the biaxially-oriented SiC precursor layer on the SiC single-crystalline substrate, the biaxially-oriented SiC layer may be formed on the SiC substrate by epitaxial growth without being subjected to a heat treatment step to be described later. However, the biaxially-oriented SiC precursor layer is not in an oriented state during the production, that is, amorphous or non-oriented polycrystalline. The rearrangement of crystals is preferably produced with SiC as a seed crystal during the heat treatment step. This makes it possible to effectively reduce crystal defects reaching the surface of the biaxially-oriented SiC layer. Although the reason is not clear, this is considered to be because the crystal defects occurring in the lower part of the biaxially-oriented SiC layer are likely to annihilate each other. Therefore, it is preferable to select a condition in which the biaxially-oriented SiC layer is not formed by epitaxial growth in the formation step of the biaxially-oriented SiC precursor layer when the various CVD methods, the sublimation method, the solution growth method and the like are used.

However, preferred is a technique of directly forming the biaxially-oriented SiC precursor layer on the SiC single-crystalline substrate according to the aerosol deposition (AD) method, the various heat CVD methods and the like, or a technique of placing the polycrystalline body separately produced by the sublimation method, the various CVD methods, and sintering and the like on the SiC single-crystalline substrate. The use of these methods makes it possible to form the dense biaxially-oriented SiC precursor layer in a relatively short time, which easily form the biaxially-oriented SiC layer by epitaxial growth with the SiC substrate as the seed crystal during the heat treatment. In particular, the AD method has a relatively fast film formation rate without requiring a high-vacuum process, which is preferable also in view of manufacturing cost. In the technique of using the previously produced polycrystalline body as the biaxially-oriented SiC precursor layer, in order to improve adhesion between the polycrystalline body and the SiC single-crystalline substrate, devices such as sufficient smoothness of the surface of the polycrystalline body are required. For this reason, the technique of directly forming the biaxially-oriented SiC precursor layer is preferable in the viewpoint of cost. A technique of placing the previously produced green body on SiC is also preferable as a simple technique, but the biaxially-oriented SiC precursor layer is composed of powders, which requires a densification process for sintering in the heat treatment step to be described later. In any of the techniques, known conditions can be used, but a method for directly forming the biaxially-oriented SiC precursor layer on the SiC single-crystalline substrate according to the AD method or the heat CVD method, and a technique of placing the previously produced green body on the SiC single-crystalline substrate will be described later.

Figure 3:
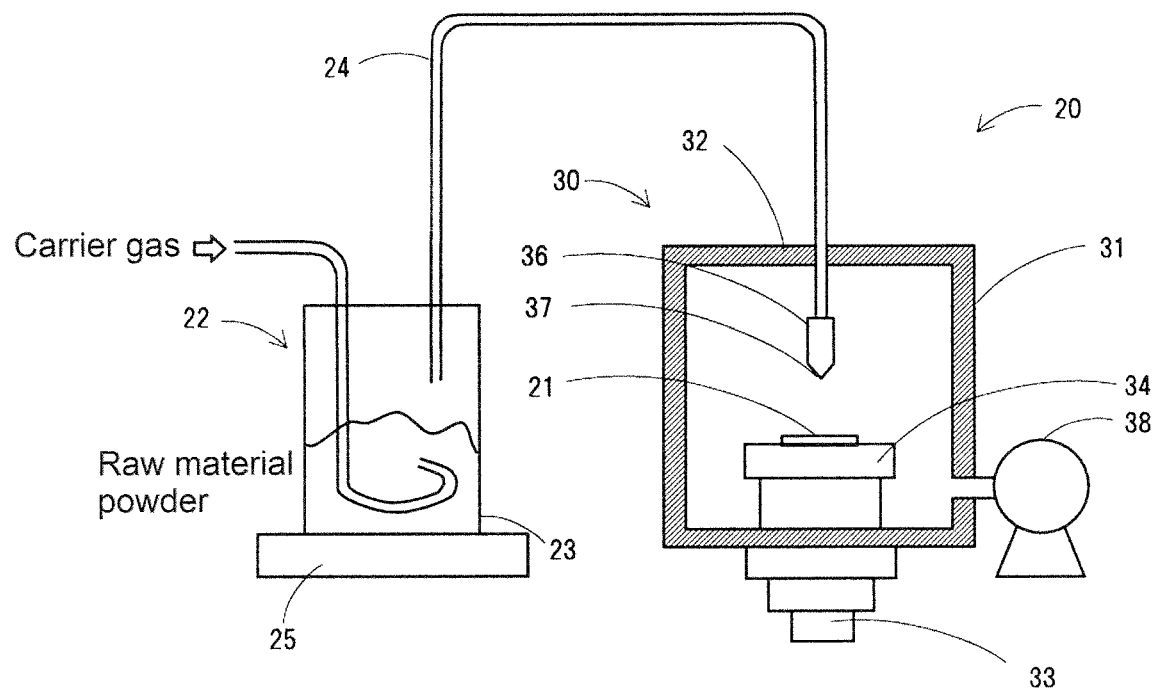
FIG. 3 is a schematic cross-sectional view showing the configuration of an aerosol deposition (AD) film formation apparatus.

The AD method is a technique of mixing fine particles or raw materials of the fine particles with a gas to form an aerosol, injecting the aerosol at a high speed from a nozzle so that the aerosol collides with a substrate, to form a coating, and is characterized in that the AD method can form a densified coating at normal temperature. FIG. 3 shows an example of a film formation apparatus (aerosol deposition (AD) apparatus) used in the AD method. A film formation apparatus 20 shown in FIG. 3 is configured as an apparatus used for the AD method for injecting a raw material powder onto a substrate under a pressure lower than an atmospheric pressure. The film formation apparatus 20 includes an aerosol generating part 22 for generating an aerosol of a raw material powder containing raw material components and a film forming part 30 for injecting the raw material powder onto a SiC single-crystalline substrate 21 to form a film containing the raw material components. The aerosol generating part 22 includes an aerosol generating chamber 23 for accommodating the raw material powder and generating an aerosol upon receiving the supply of a carrier gas from a gas cylinder (not shown), a raw material supply pipe 24 for supplying the generated aerosol to the film forming part 30, and a vibrator 25 for vibrating the aerosol generating chamber 23 and the aerosol present therein at a frequency of 10 to 100 Hz. The film forming part 30 includes a film forming chamber 32 where the aerosol is injected onto the SiC single-crystalline substrate 21, a substrate holder 34 which is provided inside the film forming chamber 32 to fix the SiC single-crystalline substrate 21, and an X-Y stage 33 for moving the substrate holder 34 in the X axis-Y axis direction. The film forming part 30 includes an injection nozzle 36 having a slit 37 formed at the tip for injecting the aerosol onto the SiC single-crystalline substrate 21, and a vacuum pump 38 for reducing the pressure of the film forming chamber 32.

In the AD method, it is known that pores occur in a film depending on film formation conditions, or the film becomes a green compact. For example, the form of an AD film is apt to be influenced by the collision speed of a raw material powder to a substrate, the particle size of the raw material powder, the aggregational state of the raw material powder in an aerosol, and an amount to be injected per unit time and the like. The collision speed of the raw material powder to the substrate is influenced by a difference in pressure between the film formation chamber and the injection nozzle, the opening area of the injection nozzle and the like. For this reason, in order to control the number of the pores in the biaxially-oriented SiC precursor layer, it is necessary to appropriately control these factors.

The heat CVD method can be performed by using known techniques such as a commercially available film formation apparatus. A raw material gas is not particularly limited, and as a source of supply of Si, a silicon tetrachloride ($SiCl_4$) gas, a silane ($SiH_4$) gas and the like can be used, and as a source of supply of C, a methane ($CH_4$) gas, a propane ($C_3H_8$) gas and the like can be used. When Si is excessively present while a film is formed, Si which does not contribute to growth flocculates, and the film grows while involving the Si aggregate. A film formation temperature is preferably 1000 to 2200° C., more preferably 1100 to 2000° C., and still more preferably 1200 to 1900° C.

As described above, it is known that when the film is formed on the SiC single crystal using the heat CVD method, the biaxially-oriented SiC layer may be formed on the SiC substrate by the epitaxial growth. However, the biaxially-oriented SiC precursor layer is not in an oriented state during the production, that is, amorphous or non-oriented polycrystalline. The rearrangement of crystals is preferably produced with SiC as a seed crystal during the heat treatment step. It is known that, the formation of an amorphous or polycrystalline layer on the SiC single crystal using the heat CVD method is influenced by a film formation temperature, gas flow rates of Si and C sources, a ratio thereof, and a film formation pressure and the like. The influence of the film formation temperature is large, and in the viewpoint of forming the amorphous or polycrystalline layer, the film formation temperature is preferably lower, more preferably lower than 1700° C., still more preferably 1500° C. or lower, and particularly preferably 1400° C. or lower. However, if the film formation temperature is too low, a film formation rate itself also decreases, whereby in the viewpoint of the film formation rate, the film formation temperature is preferably higher. The heat CVD method is known as a method for forming a dense film irrespective of an epitaxial film or a polycrystalline film. However, by controlling the ratio of the gas flow rates of the Si and C sources, and the film formation pressure, the pores can be formed in the film. For example, by increasing a Si/C ratio, which is the ratio of the Si source to the C source, the aggregate of Si is formed in the film, and the pores are formed by evaporation during the film formation and the heat treatment as the subsequent step. Meanwhile, by decreasing the Si/C ratio, the pores are formed in the SiC film. Therefore, in order to form the polycrystalline or amorphous biaxially-oriented SiC precursor layer containing the pores using the heat CVD method, it is necessary to appropriately control factors such as the film formation temperature, the Si/C ratio, and the total pressure.

When the previously produced green body is used as the biaxially-oriented SiC precursor layer, the raw material powder of the biaxially-oriented SiC precursor can be formed to produce the green body. For example, when press forming is used, the biaxially-oriented SiC precursor layer is a press-formed body. The press-formed body can be produced by press forming the raw material powder of the biaxially-oriented SiC precursor based on known techniques. For example, the raw material powder may be placed in a mold, and pressed at a pressure of preferably 100 to 400 kgf/cm$^2$, and more preferably 150 to 300 kgf/cm$^2$ to produce the press-formed body. The forming method is not particularly limited, and tape forming, extrusion, casting, a doctor blade method, and combinations thereof can be used other than the press forming. For example, it is preferable that when the tape forming is used, an additive such as a binder, a plasticizer, a dispersant, or a dispersion medium is appropriately added to the raw material powder to form a slurry, and the slurry is then shaped into a sheet by discharging the slurry through a narrow slit-like discharge opening. The thickness of the green body shaped into the sheet is not limited, and is preferably 5 to 500 μm in the viewpoint of handling. When a thick biaxially-oriented SiC precursor layer is required, a stacked body obtained by stacking a large number of sheet shaped bodies and having a desired thickness may be used.

Portions of these green bodies near the SiC single-crystalline substrate serve as the biaxially-oriented SiC layer during the subsequent heat treatment on the SiC single-crystalline substrate. As described above, it is necessary to sinter the green body in the heat treatment step to be described later in such a technique. After a step in which the green body is sintered, and the sintered body is integrated with the SiC single-crystalline substrate as the polycrystalline body, the biaxially-oriented SiC layer is preferably formed. When the green body does not go through the sintered state, the biaxially-oriented SiC layer may not be sufficiently formed by epitaxial growth with the SiC single crystal as the seed. For this reason, the green body may contain an additive such as a sintering aid in addition to SiC raw materials. However, the pores are also desired to be formed in the biaxially-oriented SiC layer, and it is necessary to select the additive and the heat treatment condition which make these compatible.

The biaxially-oriented SiC precursor layer may contain a component that controls the electrical properties of the biaxially-oriented SIC layer. For example, when an n-type biaxially-oriented SiC layer is formed, the biaxially-oriented SiC precursor layer may contain nitrogen. When a p-type biaxially-oriented SiC layer is formed, the biaxially-oriented SiC precursor layer may contain B and/or Al. In order to impart insulating properties to the biaxially-oriented SiC layer, the biaxially-oriented SiC precursor layer may contain nitrogen and at least any one of B and Al.

In the heat treatment step, the biaxially-oriented SiC layer is produced by subjecting a laminated body in which the biaxially-oriented SiC precursor layer is laminated or placed on the SiC single-crystalline layer to a heat treatment. A heat treating method is not particularly limited as long as the biaxially-oriented SiC layer is formed by epitaxial growth with the SiC single-crystalline substrate as the seed, and can be carried out in known heat-treating furnaces such as a tubular furnace and a hot plate. Not only the heat treatment at normal pressure (press less) but also a heat treatment under pressure such as hot press or HIP, and a combination of the heat treatment at normal pressure and the heat treatment under pressure can also be used. The atmosphere of the heat treatment can be selected from a vacuum, nitrogen, and an inactive gas atmosphere. A heat treatment temperature is preferably 1700 to 2700° C. By increasing the temperature, the crystals of the SiC polycrystalline body are likely to grow while being oriented in the c-axis and the a-axis with the SiC single crystal of the SiC single-crystalline layer as the seed crystal from the crystal growth surface of the SiC single-crystalline layer. Therefore, the heat treatment temperature is preferably 1700° C. or higher, more preferably 1850° C. or higher, still more preferably 2000° C. or higher, and particularly preferably 2200° C. or higher. Meanwhile, if the temperature is too high, a part of SiC may be lost by sublimation, or SiC may be plastic-deformed to cause defects such as warpage. Therefore, the heat treatment temperature is preferably 2700° C. or lower, and more preferably 2500° C. or lower. The heat treatment temperature and a retention time are related to the thickness of the biaxially-oriented SiC layer provided in the epitaxial growth, and can be appropriately adjusted.

It should be noted that when the previously produced green body is used for the biaxially-oriented SiC precursor layer, it is necessary to sinter the green body during the heat treatment. Pressureless firing at a high temperature, hot press, HIP, or a combination thereof is suitable. For example, when the hot press is used, a surface pressure is preferably 50 kgf/cm$^2$ or more, more preferably 100 kgf/cm$^2$ or more, and particularly preferably 200 kgf/cm$^2$ or more, and there is no particular upper limit thereof. A firing temperature is not also particularly limited as long as sintering and epitaxial growth occur, and is preferably 1700° C. or higher, more preferably 1800° C. or higher, still more preferably 2000° C. or higher, and particularly preferably 2200° C. or higher. An atmosphere during firing can be selected from a vacuum, nitrogen, an inactive gas atmosphere, or a mixed gas of nitrogen and an inactive gas. A SiC powder serving as a raw material may be any of α-SiC and β-SiC. The SiC powder is preferably composed of SiC particles having an average particle size of 0.01 to 5 µm. The average particle size refers to an average value obtained by observing a powder with a scanning electron microscope and measuring maximum diameters of 100 primary particles in a predetermined direction.

In the heat treatment step, the crystals in the biaxially-oriented SiC precursor layer grow while being oriented in the c-axis and the a-axis from the crystal growth surface of the SiC single-crystalline layer, whereby the biaxially-oriented SiC precursor layer gradually changes to the biaxially-oriented SiC layer from the crystal growth surface. The biaxially-oriented SiC layer thus produced has a defect density of $1 \times 10^1/cm^2$ or less. Thus, the reason why the defect density is remarkably low is considered as follows. First, a heat stress in the biaxially-oriented SiC layer is considered to be a cause of the occurrence of dislocation, and the biaxially-oriented SiC precursor layer has the pores, so that the heat stress when the biaxially-oriented SiC layer is formed is considered to be mitigated, which makes it possible to suppress the dislocation caused by the heat stress. Secondly, it is considered that the defects in the SiC single-crystalline layer also propagate in the biaxially-oriented SiC layer, but the propagating defects collide with the pores in the biaxially-oriented SiC precursor layer and disappear, or the annihilation of the defects, or the like occurs because the heat stress in the biaxially-oriented SiC layer is small, so that the number of the defects decreases.

The SiC composite substrate of the present invention is obtained by grinding and removing the seed crystal of the fired body thus obtained to expose the surface of the biaxially-oriented SiC layer. The surface of the exposed biaxially-oriented SiC layer is preferably polished by CMP (chemical mechanical polishing) and the like to smoothen the surface.

EXAMPLES

The present invention will be more specifically described by the following Examples.

Example 1

(1) Production of SiC Composite Substrate
(1a) Production of Oriented Precursor

Using a commercially available fine β-SiC powder as a raw material powder (volume basis D50: 0.7 µm), and a commercially available SiC single-crystalline substrate (n-type 4H—SiC, diameter: 50.8 mm (2 inches), Si surface, (0001) surface, off angle: 4°, thickness: 0.35 mm, no orientation flat) as a substrate, an AD film was formed on a SiC single-crystalline substrate by an aerosol deposition (AD) apparatus shown in FIG. 3.

AD film formation conditions were as follows. First, N$_2$ was used as a carrier gas, and a film was formed using a nozzle made of ceramic and having a slit having a long side of 5 mm and a short side of 0.4 mm. The scan conditions of the nozzle included repeated scan of movement of 55 mm in a travel direction perpendicular to the long side of the slit at the scanning speed of 0.5 mm/s, movement of 5 mm in the direction of the long side of the slit, movement of 55 mm in a backward direction perpendicular to the long side of the slit, and movement of 5 mm in an opposite direction to an initial position in the direction of the long side of the slit. When the nozzle was moved by 55 mm from the initial position in the direction of the long side of the slit, the nozzle was moved in an opposite direction to the movement direction, and returned to the initial position. This was taken as one cycle, and repeated for 100 cycles. In the film formation of 1 cycle at room temperature, the set pressure and flow rate of the carrier gas, and a chamber internal pressure were respectively adjusted to 0.06 MPa, 6 L/min, and 100 Pa or less. The thickness of an AD film thus formed was about 10 μm, and this film was taken as an AD film 1. Next, an AD film 2 was produced on the AD film 1 under the same conditions as those of the AD film 1 except that the nozzle was switched for a nozzle made of ceramic and having a slit having a long side of 5 mm and a short side of 0.3 mm, and the number of cycles was set to 500. The thickness of the AD film 2 thus formed was about 50 μm. An AD film of about 60 μm including the AD films 1 and 2 was obtained.

(1b) Heat Treatment of Biaxially-Oriented SiC Precursor Layer

The SiC substrate on which the AD film had been formed was removed from an AD apparatus, and annealed at 2400° C. in an argon atmosphere for 5 hours.

(1c) Grinding and Polishing

A single crystal part of the obtained SiC substrate was ground and removed to expose the surface of a biaxially-oriented SiC layer 12. The exposed surface was polished by using a diamond abrasive grain, and then subjected to CMP (chemical mechanical polishing) finishing. Thus, a SiC composite substrate 10 was obtained. At this time, the delamination, breaking and cracking of the substrate due to grinding and polishing operations did not occur.

(2) Evaluations

The SiC composite substrate 10 thus obtained was subjected to the following various evaluations.

<Cross-Section Observation>

Figure 4:
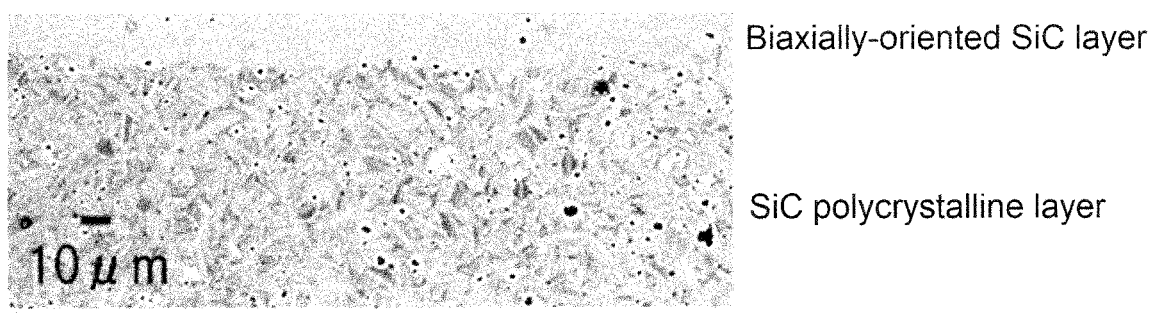
FIG. 4 is a cross-sectional SEM image of the SiC composite substrate produced in Example 1.

The cross-section of a central part of the SiC composite substrate 10 was subjected to mirror polishing using a diamond abrasive grain, and then subjected to CMP (chemical mechanical polishing) finishing. The obtained cross-section was taken by a scanning electron microscope (SU-5000 manufactured by Hitachi High-Technologies Corporation). At this time, as shown in FIG. 4, the biaxially-oriented SiC layer 12 and the SiC polycrystalline layer 14 could be easily discriminated from each other according to a channeling contrast difference due to a difference in a crystal orientation.

<Number of Pores and Pore Diameters>

In the above cross-section observation, reflection electron images of 20 fields of view (size of one field of view: 178 μm×256 μm) including the biaxially-oriented SiC layer 12 and the SiC polycrystalline layer 14 were taken at 500× magnification, and the number of pores and pore diameters were measured for each of the layers. The number of the pores of each of the layers was calculated by visually counting the number of the pores of the SiC polycrystalline layer 14 or the biaxially-oriented SiC layer 12 of each of 20 fields of view, and dividing the number of the pores by the total cross-sectional area of the SiC polycrystalline layer 14 or the biaxially-oriented SIC layer 12, and evaluated as the number of the pores per 1 $cm^2$ of a unit cross-sectional area. The pore diameter of each of the layers was a numerical value obtained by increasing the average value of lengths of longest sides of the pores of 20 fields of view by half. The results were shown in Table 1.

<Defect Density of Biaxially-Oriented SiC Layer>

The SiC composite substrate 10 produced in the above (1) was used as an evaluation sample. The evaluation sample was placed together with a KOH crystal in a crucible made of nickel, and subjected to an etching treatment in an electric furnace at 500° C. for 10 minutes. The evaluation sample subjected to the etching treatment was washed, and the surface of the evaluation sample was observed with an optical microscope to count the number of pits. Specifically, any site of the surface of the evaluation sample was taken for 100 fields of view of 2.3 mm in height and 3.6 mm in width at 50× magnification to count the total number of pits. The counted total number of pits was divided by the total area of 8.05 $cm^2$ to calculate a defect density. The results were shown in Table 1.

<Biaxial Orientation>

When the inverse pole figure mapping of the surface (plate surface) of the biaxially-oriented SiC layer 12 or a cross-section orthogonal to the plate surface was measured using an electron back scatter diffraction patterns (EBSD) method, an inclination angle distribution had an inclination angle of 0.5° or less in both an approximately normal direction and an approximately plate surface direction, so that the SiC layer 12 was determined to be biaxially-oriented.

Example 2

An experiment was performed in the same manner as in Example 1 except that a film was formed for 600 cycles using a slit having a long side of 5 mm and a short side of 0.4 mm without switching the nozzle under the AD film formation conditions of the above (1a), to obtain an AD film of about 60 μm. The obtained results were shown in Table 1.

Example 3

An experiment was performed in the same manner as in Example 1 except that, under the AD film formation conditions of the above (1a), a nozzle slit had a long side of 5 mm and a short side of 0.1 mm during the formation of an AD film 1, and a nozzle slit had a long side of 5 mm and a short side of 0.2 mm during the formation of an AD film 2. The obtained results were shown in Table 1.

TABLE 1

| | SiC polycrystalline layer | | Biaxially-oriented SiC layer | | | SiC composite substrate Occurrence of delamination, breaking and cracking due to grinding and polishing operations |
|---|---|---|---|---|---|---|
| | Number of pores (pores/$cm^2$) | Pore diameter (μm) | Number of pores (pores/$cm^2$) | Pore diameter (μm) | Defect density (/$cm^2$) | |
| Ex. 1 | $4.2 \times 10^6$ | 1.9 | $5.6 \times 10^5$ | 2.0 | $3.1 \times 10^0$ | None |
| Ex. 2 | $3.4 \times 10^5$ | 1.9 | $4.2 \times 10^5$ | 2 | $4.6 \times 10^0$ | None |
| Ex. 3 | $1.8 \times 10^5$ | 3.5 | 0 | — | $9.1 \times 10^0$ | None |

From the above results, the pores are present in the SiC polycrystalline layer 14 and/or the biaxially-oriented SiC layer 12, whereby a residual stress during grinding and polishing is considered to be effectively mitigated to suppress detachment of a joined surface (delamination), breaking and cracking. When the pores were present in the SiC polycrystalline layer 14 and the biaxially-oriented SiC layer 12, and the number of the pores in the SiC polycrystalline layer 14 was greater than that in the biaxially-oriented SiC layer 12, the defect density was the lowest (see Example 1). When the pores were present in the SiC polycrystalline layer 14 and the biaxially-oriented SiC layer 12, and the number of the pores in the SiC polycrystalline layer 14 was substantially the same as that in the biaxially-oriented SiC layer 12, the defect density was medium (see Example 2). When the pores were present only in the SiC polycrystalline layer 14, the defect density was the highest (see Example 3). From these results, it is considered that the number of the pores is preferably greater, and when the number of the pores in the SiC polycrystalline layer 14 is greater than that in the biaxially-oriented SiC layer 12, the stress during the film formation and the heat treatment is more effectively mitigated.

What is claimed is:

1. A SIC composite substrate comprising:
    a biaxially-oriented SiC layer in which SIC is oriented in both a c-axis direction and an a-axis direction; and
    a SIC polycrystalline layer provided on one surface of the biaxially-oriented SIC layer,
    wherein pores are present in the SiC composite substrate.

2. The SiC composite substrate according to claim 1, wherein pores are present in the SIC polycrystalline layer.

3. The SIC composite substrate according to claim 2, wherein pores are also present in the biaxially-oriented SIC layer.

4. The SiC composite substrate according to claim 3, wherein the number of the pores per 1 $cm^2$ of a unit cross-sectional area in the SIC polycrystalline layer is greater than the number of the pores per 1 $cm^2$ of a unit cross-sectional area in the biaxially-oriented SIC layer.

5. The SiC composite substrate according to claim 1, wherein pores are absent in the biaxially-oriented SIC layer.

6. The SIC composite substrate according to claim 1, wherein the biaxially-oriented SiC layer has a defect density of $1.0 \times 10^1/cm^2$ or less.

7. A composite substrate for a semiconductor device comprising:
    the SIC composite substrate according to claim 1; and
    a functional layer for a semiconductor device provided on the biaxially-oriented SiC layer of the SIC composite substrate.

* * * * *